(12) United States Patent
Kwan et al.

(10) Patent No.: US 11,127,876 B2
(45) Date of Patent: Sep. 21, 2021

(54) METHOD OF PREVENTING CONTAMINATION OF LED DIE

(71) Applicant: Lumileds LLC, San Jose, CA (US)

(72) Inventors: Yue Chau Kwan, Singapore (SG); Li Ma, Singapore (SG); Liang Zhang, Singapore (SG); Kenneth Morgan Davis, Raleigh, NC (US); Bing Xuan Li, Singapore (SG)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/728,519

(22) Filed: Dec. 27, 2019

(65) Prior Publication Data

US 2020/0135963 A1    Apr. 30, 2020

Related U.S. Application Data

(63) Continuation of application No. 15/842,391, filed on Dec. 14, 2017, now Pat. No. 10,522,708.

(51) Int. Cl.
| | |
|---|---|
| *H01L 33/00* | (2010.01) |
| *H01L 33/62* | (2010.01) |
| *H01L 23/00* | (2006.01) |
| *H01L 33/10* | (2010.01) |
| *H01L 33/52* | (2010.01) |
| *H01L 33/40* | (2010.01) |

(52) U.S. Cl.
CPC ............ *H01L 33/005* (2013.01); *H01L 24/01* (2013.01); *H01L 33/10* (2013.01); *H01L 33/405* (2013.01); *H01L 33/52* (2013.01); *H01L 33/62* (2013.01); *H01L 2933/0016* (2013.01)

(58) Field of Classification Search
CPC ......... H01L 33/20; H01L 33/60; H01L 33/62; H01L 24/01; H01L 21/76838; H01L 51/0016; H01L 21/0272; H01L 51/002; H01L 51/0021; H01L 33/005; H01L 33/405; H01L 33/10; H01L 33/52; H01L 2933/0016
See application file for complete search history.

(56) References Cited

U.S. PATENT DOCUMENTS

| | | |
|---|---|---|
| 8,106,412 B2 | 1/2012 | Takao et al. |
| 8,154,042 B2 | 4/2012 | Aldaz et al. |
| 9,397,269 B2 | 7/2016 | Chae et al. |
| 9,425,356 B2 | 8/2016 | Park |
| 9,530,939 B2 | 12/2016 | Chae et al. |

(Continued)

FOREIGN PATENT DOCUMENTS

| | | |
|---|---|---|
| EP | 2565944 | 3/2013 |
| WO | 2006/082687 | 8/2006 |

*Primary Examiner* — Latanya N Crawford Eason
(74) *Attorney, Agent, or Firm* — Volpe Koenig

(57) ABSTRACT

A method for allowing a reflective layer to abut against an edge of a metal contact while preventing contamination of a metal contact for an LED die is provided. The method includes encapsulating an electrical contact (i.e. metal contact) via with a barrier layer prior to deposition of a reflective film layer. The barrier layer encapsulates the metal contact by defining a mask pattern with a larger size than the metal contact via, which prevents the metal contact from becoming contaminated by the reflective film. This encapsulation reduces contamination of the metal contact and also reduces the voltage drop during operation of the LED die.

16 Claims, 15 Drawing Sheets

(56) References Cited

U.S. PATENT DOCUMENTS

| | | |
|---|---|---|
| 9,583,353 B2 | 2/2017 | Han |
| 9,847,457 B2 | 12/2017 | Chae et al. |
| 9,859,469 B2 | 1/2018 | Chae et al. |
| 2010/0046566 A1 | 2/2010 | Kudo |
| 2010/0051978 A1 | 3/2010 | Katsuno et al. |
| 2011/0014734 A1 | 1/2011 | Lu |
| 2012/0080689 A1 | 4/2012 | Nabekura et al. |
| 2012/0164797 A1 | 6/2012 | Lowenthal et al. |
| 2013/0001588 A1 | 1/2013 | Fukuda |
| 2013/0049053 A1 | 2/2013 | Kususe et al. |
| 2013/0168721 A1 | 7/2013 | Hori et al. |
| 2015/0214440 A1 | 7/2015 | Chae et al. |
| 2016/0211410 A1* | 7/2016 | Jang .................. H01L 27/153 |
| 2018/0254383 A1 | 9/2018 | Perzlmaier et al. |

* cited by examiner

| Die Design | Forward Voltage | | | | Flux Level | | | | Efficacy | | | |
|---|---|---|---|---|---|---|---|---|---|---|---|---|
| CD Size | 5μm | 6μm | 8μm | 10μm | 5μm | 6μm | 8μm | 10μm | 5μm | 6μm | 8μm | 10μm |
| Original | --- | --- | 100% | --- | --- | --- | 100% | --- | --- | --- | 100% | --- |
| Embodiment 1 | 102% | 99% | 98% | 97% | 110% | 109% | 106% | 102% | 108% | 110% | 108% | 105% |

FIG. 4

METHOD OF PREVENTING CONTAMINATION OF LED DIE

CROSS REFERENCE TO RELATED APPLICATION(S)

This application is a continuation U.S. patent application Ser. No. 15/842,391, filed Dec. 14, 2017, which is/are incorporated by reference as if fully set forth.

FIELD OF INVENTION

The present invention generally relates to light emitting diodes (LEDs), and more particularly relates to minimizing contamination during processing of LEDs.

BACKGROUND

Applications including varying LED die architectures are known. Vias are created in areas of LED arrangements where electrical contact is desired. It is understood by those of ordinary skill in the art that mobile atoms such as silver (Ag) and aluminum (Al) can migrate or otherwise relocate into vias during deposition or in subsequent processing steps.

This is particularly a problem in certain LED dies because Ag is known to contaminate the underlying epitaxy. The typical method for preventing contamination is to provide a barrier layer (or dielectric layer 114 as shown in FIG. 1) and a large offset between the via in the underlying barrier material and the via in the Ag layer. The Ag layer is subsequently sealed by capping with a guard sheet material, such as nickel (Ni) or tungsten (W), which results in a reduction in the total surface area of the Ag layer and reduces the reflective area on each LED die.

Producing LED dies typically involves multiple rounds of masking and photolithography, which requires a large via size in the second deposition layer to provide a margin for issues resulting from via misalignment. This mismatch in the size of vias between the first and second deposition layers defines the size of a critical dimension (CD) and if etching is used to form the via, this results in a large undercut, causing an enlarged CD.

Etching for semiconductor materials is well known, and is described in U.S. Pat. No. 9,583,353, which is incorporated by reference as if fully set forth herein. Applications including wafer bonding for LED architecture are also well known. One other known type of LED die is disclosed in U.S. Pat. No. 8,154,042, which is incorporated by reference as if fully set forth herein. These known types of devices have produced significant increases in light output. However, there are still contamination issues.

The reflective layer in LED dies contaminates the associated metal contact in a variety of ways. Contamination can occur due to direct deposition on top of contact metal, the reflective film anneal process, incursion of etch products in contact with the via during the etch process of the reflective layer, and/or voiding in a subsequent bonding layer due to removal of material from the first barrier layer during formation of the reflective layer. If trace elements of reflective film come into electrical contact with the underlying epitaxy, then a consistent high forward voltage can result.

It would be desirable to provide a reliable method of preventing contamination of the metal contacts in an LED die.

SUMMARY

Briefly stated, a method for preventing contamination at a metal contact for an LED die is provided.

The present disclosure provides methods of applying a barrier layer to encapsulate the electrical contact (i.e. metal contact) which minimizes the critical dimension (CD) in the reflective layer, thereby increasing the total reflective surface on the LED die. The barrier layer encapsulates the metal contact by defining a mask pattern with a larger size than the metal contact via, which prevents the metal contact from becoming contaminated by the reflective film. This encapsulation prevents contamination of the metal contact and also reduces the voltage increase during operation of the LED die.

BRIEF DESCRIPTION OF THE DRAWINGS

The foregoing Summary as well as the following Detailed Description will be best understood when read in conjunction with the appended drawings. In the drawings:

FIG. 4 illustrates a table showing characteristics for an LED die.

DETAILED DESCRIPTION OF THE PREFERRED EMBODIMENTS

Figure 1A:
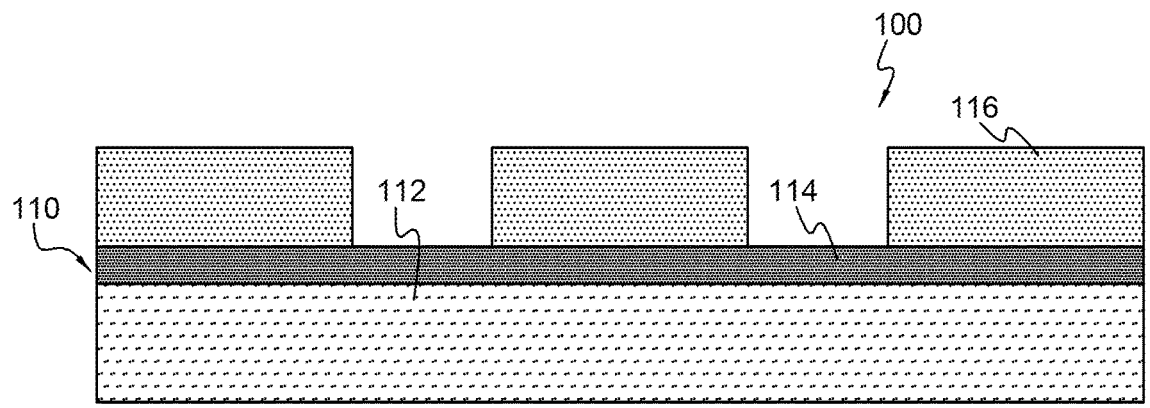
FIGS. 1A-1H illustrate steps for forming an LED die according to a first embodiment.

It is to be understood that the figures and descriptions for preventing contamination in an LED die have been simplified to illustrate elements that are relevant for a clear understanding, while eliminating, for the purpose of clarity, many other elements found in typical electronics packaging. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein.

During the etch removal process of LED die formation, the reflective layer is etched away from the metal contact via, and an over-etch process is used to ensure thorough removal of reflective film from metal contact via to prevent contamination. This etch removal process excessively reduces the total area of the mirror total reflective area and reduces the light output of the LED die. The embodiments disclosed herein eliminate the reflective film etch process with a more precisely controllable barrier layer dimension that reduces the light output lost due to the loss of the reflective area. In existing applications, a first barrier layer, which is removed partially or fully by the reflective film etch process, changes the die topography and causes large voids beneath the metal contact via after the wafer bonding process. The embodiments disclosed herein improve the die topography by eliminating the reflective film etch process and reduces the voids significantly.

A gap typically exists between the second barrier layer and the reflective film in LED dies due to over-etching of the reflective film layer. Mirror mask misalignment can result in the reflective film sitting directly on top of contact metal, and a subsequent thermal process both accelerates cross contamination and causes forward voltage to increase in an uncontrollable manner. The embodiments disclosed herein provide a design for LED dies with a sufficiently large barrier size to fully encapsulate the metal contact via, which eliminates reflective film from contaminating the metal contact. Embodiments disclosed herein deposit a blanket sheet of reflective mirror layer to maximize the mirror area and improve light output.

Production of an LED die includes multiples steps, which are illustrated in FIGS. 1A-1H. In an embodiment, the LED die is an aluminum indium gallium phosphide (AlInGaP) LED device. However, those of ordinary skill in the art would recognize from the present disclosure that alternative types of LED dies can be produced. As an initial step 110 shown in FIG. 1A, an epitaxy layer layer 112, a dielectric layer 114, and a first photoresistive layer 116 are provided. In an embodiment, the epitaxy layer 112 includes GaP. One of ordinary skill in the art would recognize from the present disclosure that alternative types of semiconductor compound materials can be used. In an embodiment, the dielectric layer 114 includes silicon dioxide. One of ordinary skill in the art would recognize from the present disclosure that alternative types of dielectric layers can be used.

Figure 1B:
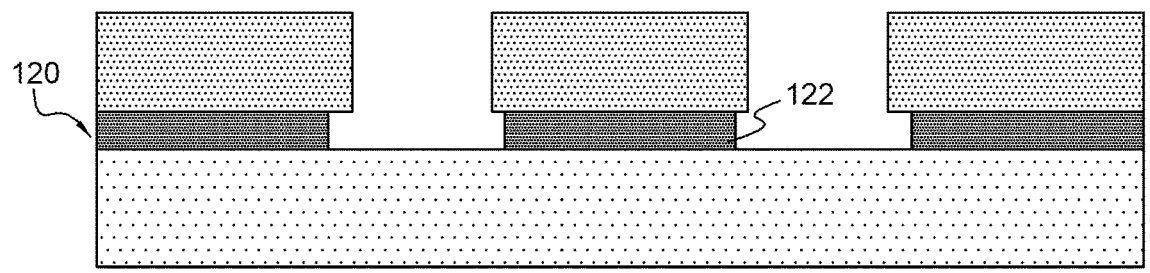
Figure 1C:
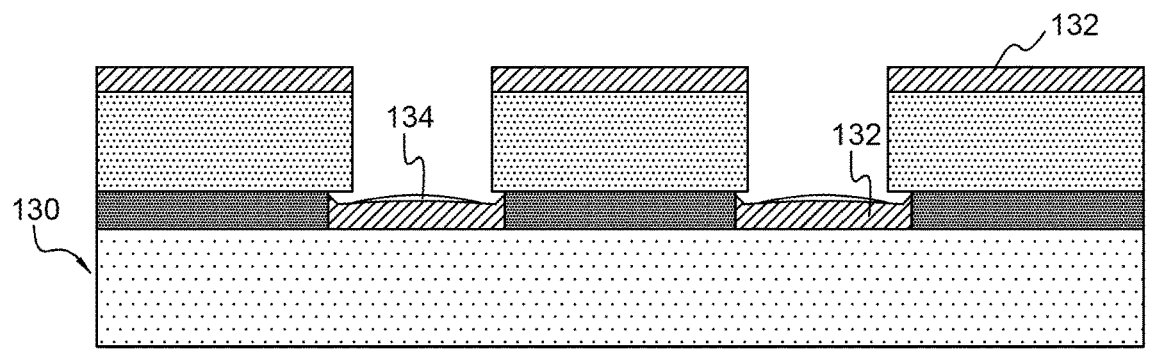

During step 120 shown in FIG. 1B, vias 122 are created in the dielectric layer 114 where electrical contact is desired. During step 130 shown in FIG. 1C, the vias 122 are filled with a metal contact 132 for electrical contact formation and a first barrier layer 134 is formed on top of metal contact 132 to prevent contamination of the contact metal. In an embodiment, the metal contact 132 is formed from a gold beryllium (AuBe) compound. One of ordinary skill in the art would recognize from the present disclosure that alternative types of metal contact can be used.

Figure 1D:
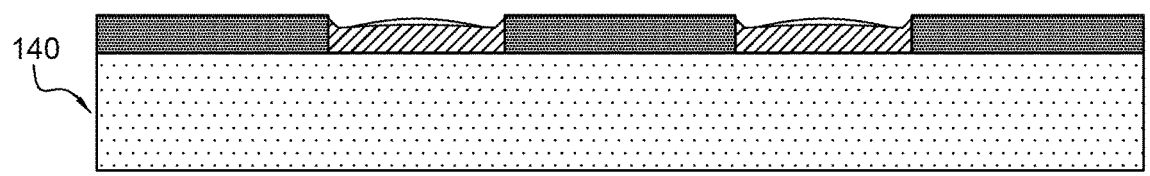
Figure 1E:
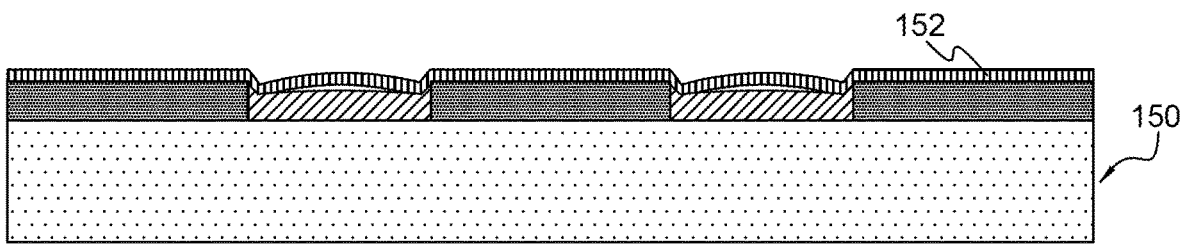
Figure 1F:
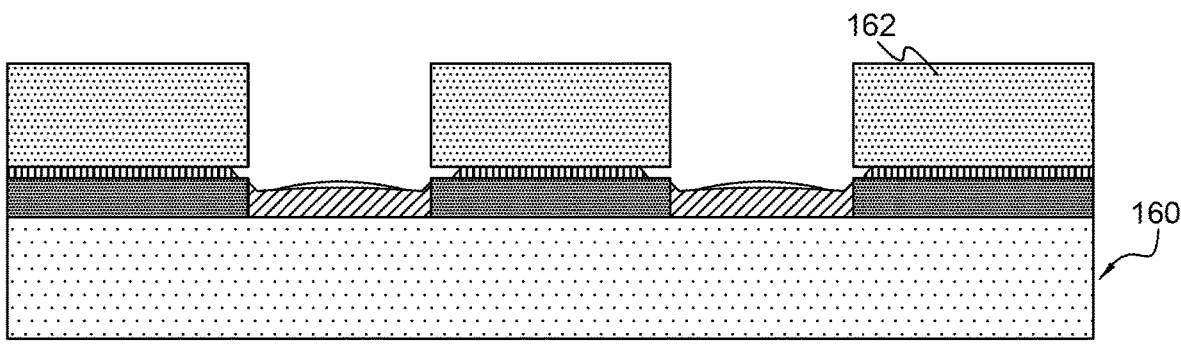
Figure 1G:
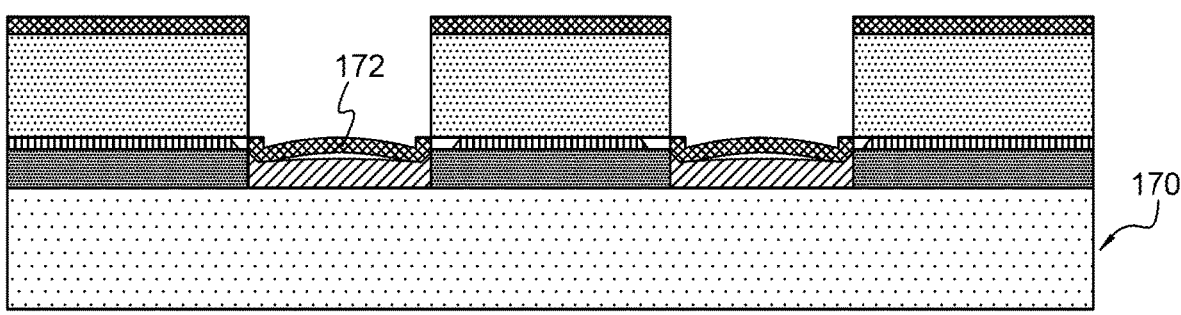
Figure 1H:
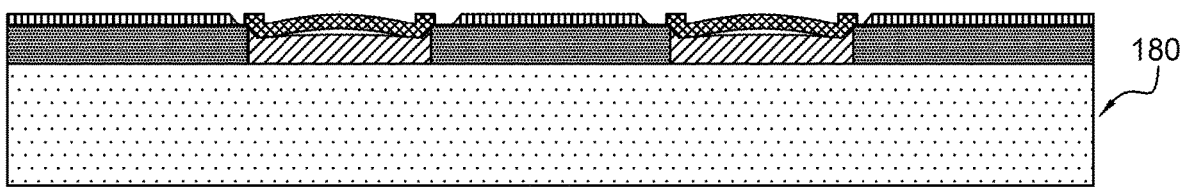

As shown in FIG. 1D, during step 140, the first photoresistive layer 116 is removed. As shown in step 150 in FIG. 1E, a reflective film layer 152 is formed on top of the dielectric layer 114 and the first barrier layer 134. In an embodiment, an anneal process is used to improve adhesion of reflective film layer 152. One of ordinary skill in the art would recognize that the anneal process can be omitted or other methods/arrangements can be used to improve adhesion. During step 160 shown in FIG. 1F, a second photoresistive layer 162 is deposited on the reflective film layer 152 and patterned. The reflective film layer 152 is also removed from the metal contact region 132. As shown in FIG. 1G, during step 170, a second barrier layer 172 is deposited on the metal contact 132 to prevent contamination of the metal contact 132. As shown in FIG. 1II, during step 180, the second photoresistive layer 162 is removed (along with the second barrier layer 172 in regions of the second photoresistive layer 162), and a top surface of the reflective film layer 152 and a top surface of the second barrier layer 172 are coplanar.

During removal of the reflective film layer 152 from the top surface of the metal contact vias, partial etching of the first barrier layer 134 causes problems. Trace amounts of the reflective film layer 152 may enter the via during the formation and annealing steps, which causes an increase in the operating voltage of the LED device. Etching by-products are also generated during the etching of the reflective film layer 152, which may also cause an increase in the operating voltage of the device. Additionally, as the reflective film layer 152 is etched away from the metal contact region, material is removed from underneath the resist 162, causing a reduction in the total area of reflective film and causes a correlated reduction in light output of the LED die. The guard sheet (i.e. the second barrier layer 172) creates a region of low reflectivity between the top edge of the dielectric via and an outer edge of the guard sheet and a region of even lower reflectivity between the outer edge of the guard sheet and an inner edge of the reflective film. The first barrier layer 134, which is removed partially or fully by the reflective film etch process, changes the topography of the die, and can lead to large voids beneath the metal contact via after the wafer bonding process. Finally, during the masking process to enable etching away of the reflective film layer 152 from the metal contact via, any gross mask misalignment can cause the reflective film to be positioned on top of the metal contact 132, which is undesirable and leads to contamination of the metal contact 132. This issue is best illustrated by the right half side of FIG. 2, which is discussed in more detail below.

Figure 2:
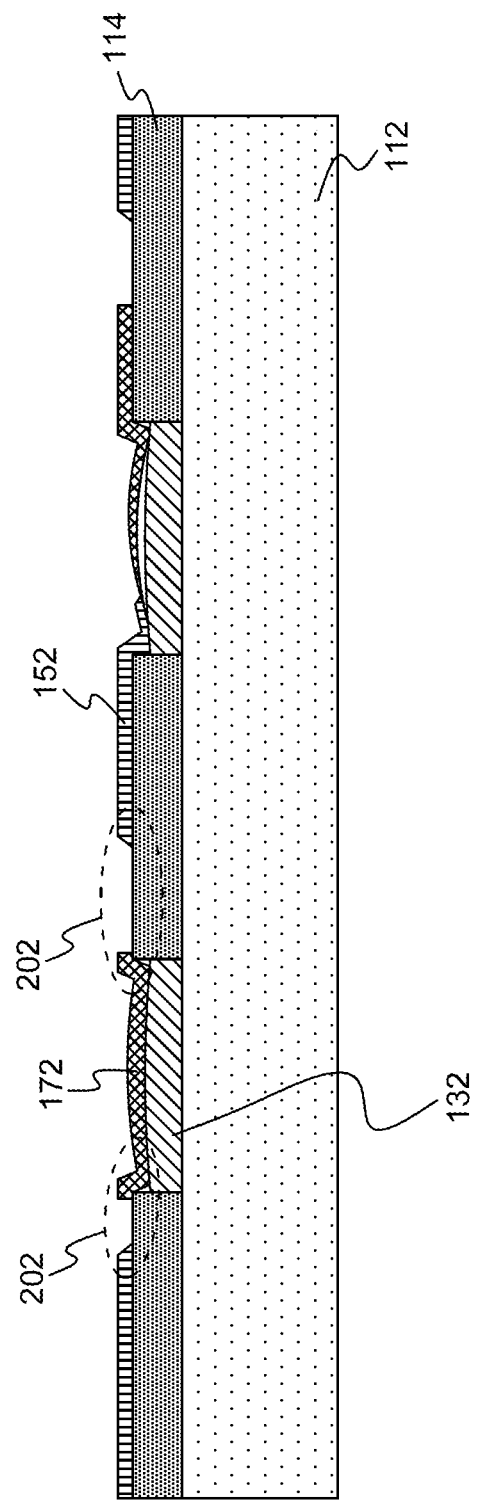
FIG. 2 illustrates gaps formed between a barrier layer and a reflective layer in an LED die.

FIG. 2 illustrates a situation in which the reflective material is deposited on to the electrical contact metal due to misalignment. As shown in FIG. 2, gaps 202 are produced between the reflective film layer 152 and the second barrier layer 172 during the die formation process. These gaps 202 are undesirable and result in a loss of the reflective mirror area due to excessive over-etching, and produce a bonding void. This region has the lowest reflectivity. The region from the edge of top of the dielectric to the outer edge of the second barrier layer also has significantly lowered reflectivity compared to regions covered by silver. The embodiments disclosed herein minimize these gaps.

As disclosed generally herein, a barrier layer is provided to separate patterned islands of metal contact and a blanket sheet of a reflective mirror. The barrier layer enables contamination-free metal contact, which lowers the contact resistance and reduces the voltage drop and power consumption during LED die operation. In an embodiment, blanket sheets of reflective mirror layers, which are not partially etched away from the top of metal contact, are provided. This configuration improves the light output of LED die by maximizing the mirror area.

In an embodiment, the reflective film etching process is eliminated, which prevents mirror area loss and minimizes the light output loss. The LED die architecture disclosed herein improves the bottom contact surface topography while also significantly reducing the bonding void after the wafer bonding process. The finished LED die produced according to the embodiments disclosed herein provides improved performance by avoiding operating voltage increase, lowering power consumption, and increasing light output.

The barrier layer disclosed herein encapsulates the metal contact by providing a pattern with a larger diameter than a specific island of metal contact, hence preventing the metal contact from getting contaminated by the reflective mirror during processing or normal operation. By using formation steps and processes that allow the reflective mirror layer to be positioned directly adjacent to the guard sheet (i.e. in abutting contact) while preventing contamination of the contacts during processing and/or normal operation, light output is maximized and the operating voltage is minimized. This arrangement provides improved topography of the contact layer for LED die architectures which use submount bonding (e.g., vertical LED devices). In an embodiment, the method of forming the LED die disclosed herein provides a surface roughness reduction of approximately 20% compared to known LED dies. In an embodiment, the method of forming the LED die disclosed herein provides a surface roughness reduction of approximately 18.6% compared to known LED dies. Across the contact area, an RMS of approximately 60.0 nm is provided in known LED dies. According to an embodiment of a method disclosed herein, an RMS of less than 50.0 nm is provided. In an embodiment, an RMS of 48.8 nm is provided. As used herein, RMS is defined per ASME B46.1 as the root mean square average of the profile height deviations from the mean line.

In an embodiment, a method is provided for minimizing the offset incurred between the thin films for a mirror layer and a guard sheet which lie adjacent to each other on the dielectric layers during the formation of the electrical contact. The method includes forming a via in the dielectric layer. This step can include the formation of the via through any material present on the semiconductor prior to dielectric film deposition such that the semiconductor can be connected electrically to the external environment through the via. The method includes forming an electrical contact on the semiconductor through the via using a single layer or multiple layers of thin films. In an embodiment, the method includes forming a guard sheet (i.e. barrier layer) over the via as a cap or shield to prevent incursion of contaminants into the via. The method includes forming a reflective layer on the dielectric and achieving tight CD control between the reflective layer and guard sheet.

Figure 3A:
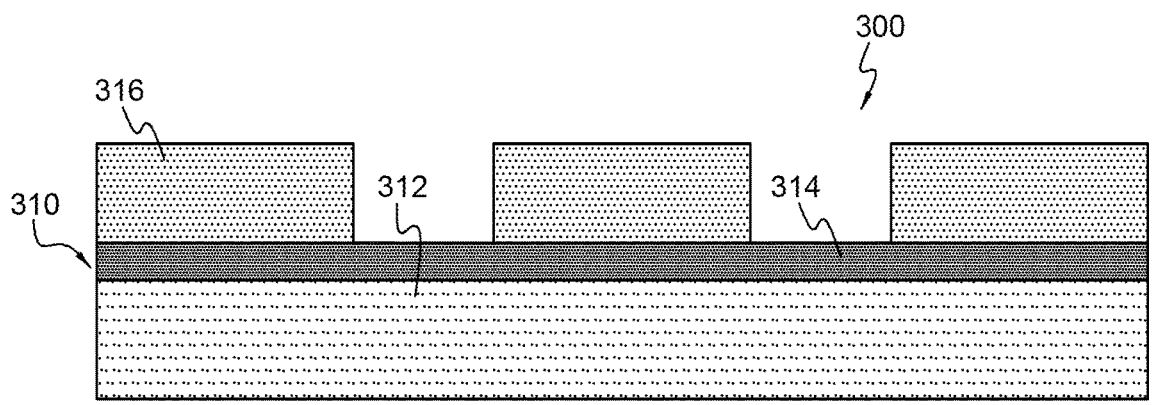
FIGS. 3A-3G illustrate steps for forming an LED die according to a second embodiment.
Figure 3B:
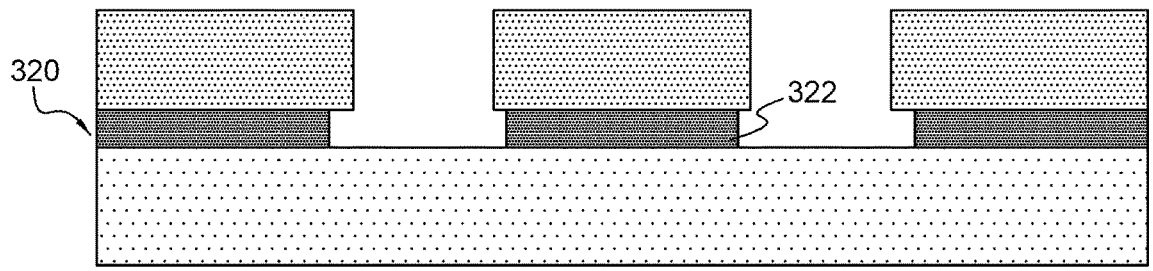
Figure 3C:
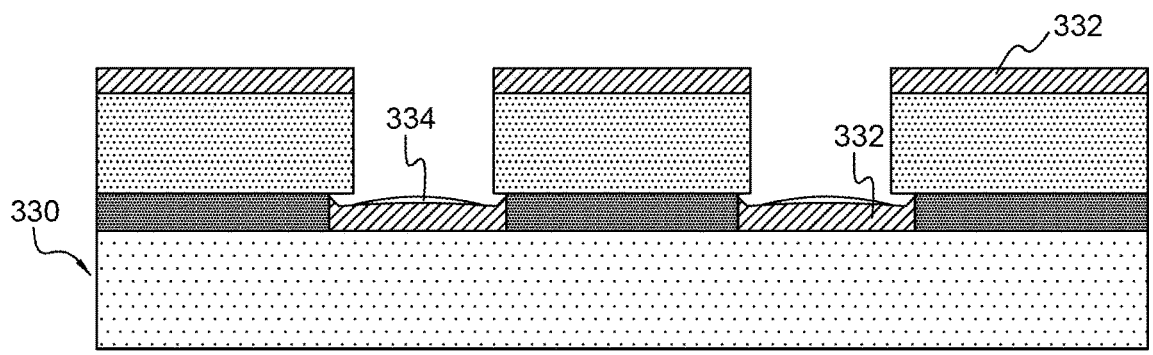
Figure 3D:
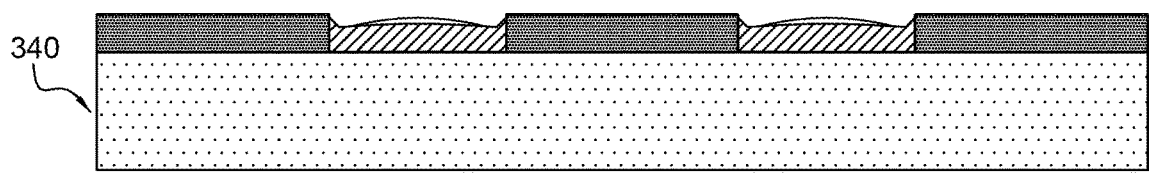
Figure 3E:
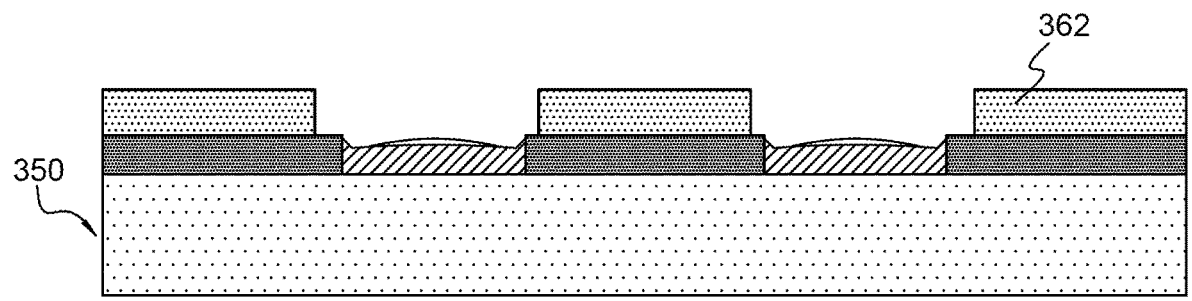
Figure 3F:
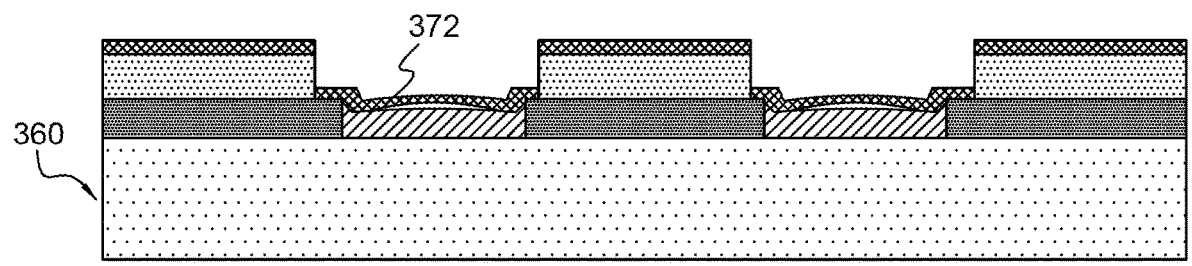
Figure 3G:
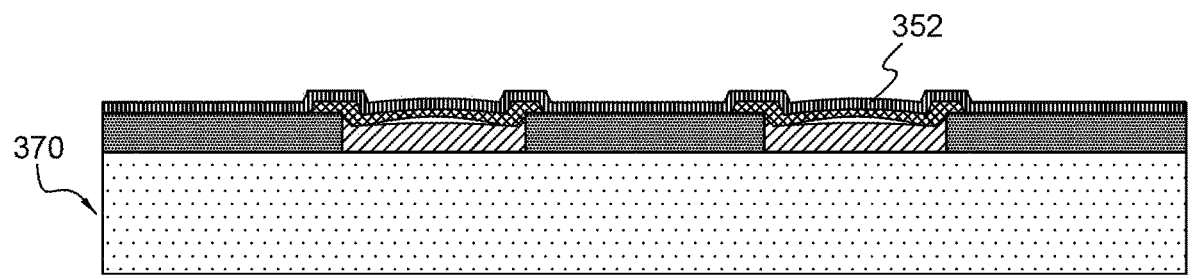

As shown in FIGS. 3A-3G, one method 300 of forming an LED die according to an embodiment is disclosed. FIGS. 3A-3D generally correspond to FIGS. 1A-1D, and these steps are generally identical to the steps described above, i.e. step 110 corresponds to step 310, step 120 corresponds to step 320, etc. As shown in FIG. 3E, during step 350, a second photoresistive layer 362 is deposited on the dielectric layer 314 in areas away from regions of desired electrical contact, i.e. the metal contacts 332. The second photoresistive layer 362 is a patterned layer of photoresistive material. As shown in FIG. 3F, during step 360 a blanket of a second barrier layer 372 is deposited on the second photoresistive layer 362, the dielectric layer 314, and the metal contacts 332. The blanket of the second barrier layer 372 covers an entire top surface of the LED. As shown in FIG. 3G, during step 370, portions of the combined layers of the second photoresistive layer 362 and the second barrier layer 372 are only removed from areas away from the regions of desired electrical contact, i.e. the metal contacts 332. During step 370, a blanket layer of reflective film 352 is deposited over the entire top surface of the LED, i.e. on the dielectric layer 322 and the second barrier layer 372. This configuration ensures that the reflective film layer 352 is in contact with the second barrier layer 372 and provides a reliable configuration for preventing contamination of the metal contacts 332 with the reflective film layer 352.

The term "patterning" or "patterned" with respect to the photoresistive layers used herein can be performed according to a variety of methods. In an embodiment, the patterning is performed by lift-off. In another embodiment, the patterning is performed by wet-etching.

FIG. 4 illustrates a table showing the forward voltage, flux level, and efficacy for an existing LED die ("Original") and an embodiment of an LED die produced according to the method described herein ("Embodiment 1"). As compared to the original die design, the forward voltage is reduced by 1%, the flux is improved by 9% and the overall die efficacy improved by 10%. The reduction in forward voltage is attributed to precise control of the CD size provided by embodiment 1. Etching in the original design typically resulted in CD sizes that are larger than anticipated. In the methods described herein and the resulting LED die, the production methods allow the reflective layer to abut against the protective TiW layer, thereby increasing the total surface area of the reflective layer and increasing flux levels. The LED design of embodiment 1 has a 5 μm CD, and the TiW layer does not completely cap the 5 μm wide oxide via, which is induced by oxide over-etch in the via opening step, and results in some Ag poisoning of the contact as observed in the 2% increase in forward operating voltage (Vf). The arrangement of the reflective layer abutting the edge of the oxide via increases flux levels by 10% giving a net improvement in efficacy of 8%.

This table highlights the importance of controlling the size of the CD over the oxide via to balance between maximizing flux with no penalty in forward voltage. Where this would not have been possible in an embodiment where the Ag was etched back from the via to 8 μm, as tighter CD margins would not be feasible in production and large over-etch margins are designed into the product to prevent epi poisoning, this embodiment shows that the CD size can be significantly reduced, thereby improving total reflectance and die flux levels.

Figure 5A:
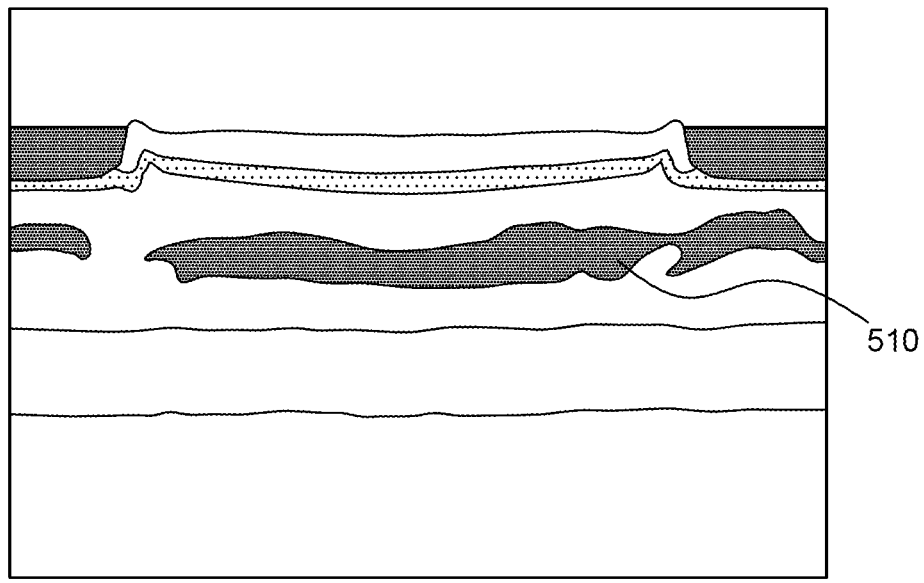
FIG. 5A illustrates the topography of an LED die according to the prior art.
Figure 5B:
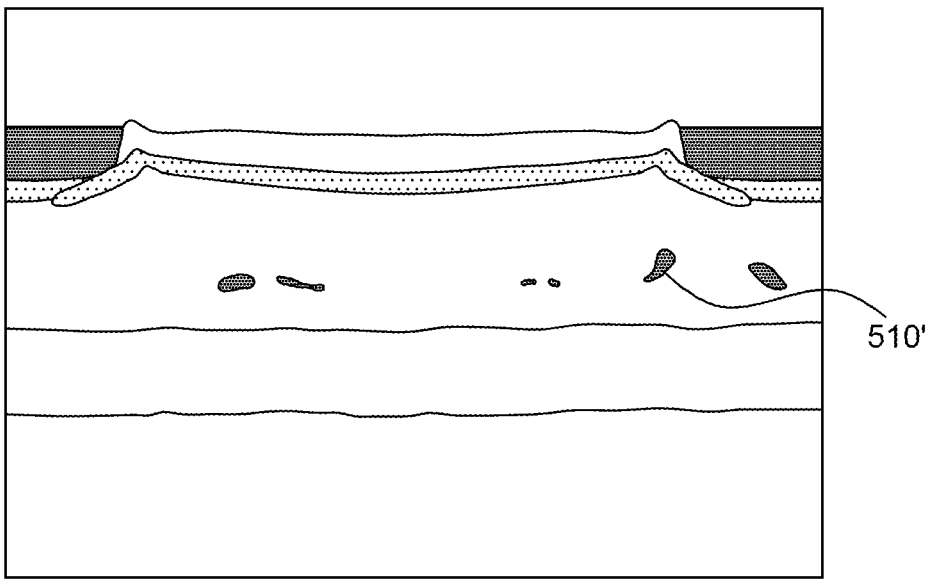
FIG. 5B illustrates the topography of an LED die according to an embodiment of the invention.

FIG. 5A illustrates a topography of an LED die produced according to the prior art. FIG. 5B illustrates a reduction in the size of voids and recovery of reflective area for an LED die produced according to the embodiments disclosed herein. With the improved topography at the metal contact, the voids 510 are reduced in size by at least 50% compared to existing LED dies. The present embodiment disclosed in FIG. 5B provides smaller voids 510' as compared to the prior art shown in FIG. 5A. A silver over etch in the LED dies create lost reflective areas in the LED die of FIG. 5A. In the embodiment of FIG. 5B, the silver recovers this lost reflective area, which improves flux.

Figure 6A:
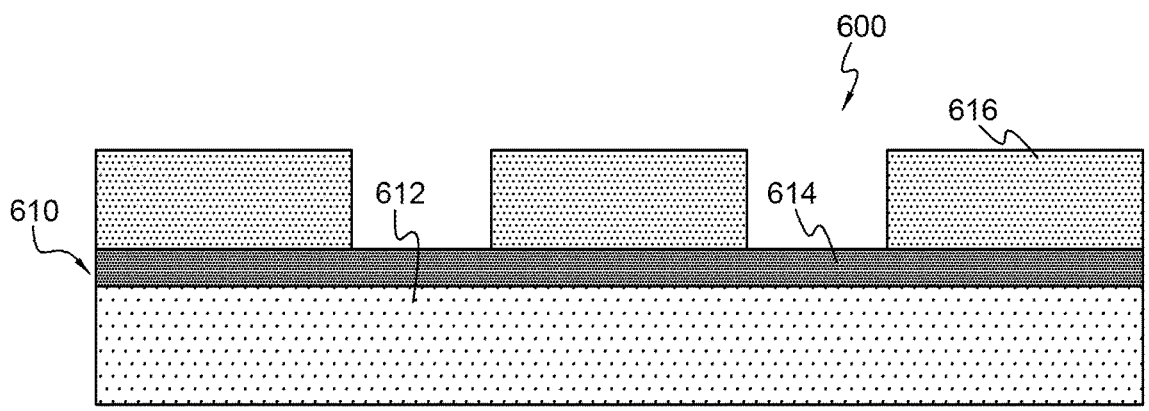
FIGS. 6A-6H illustrate steps for forming an LED die according to a third embodiment.
Figure 6B:
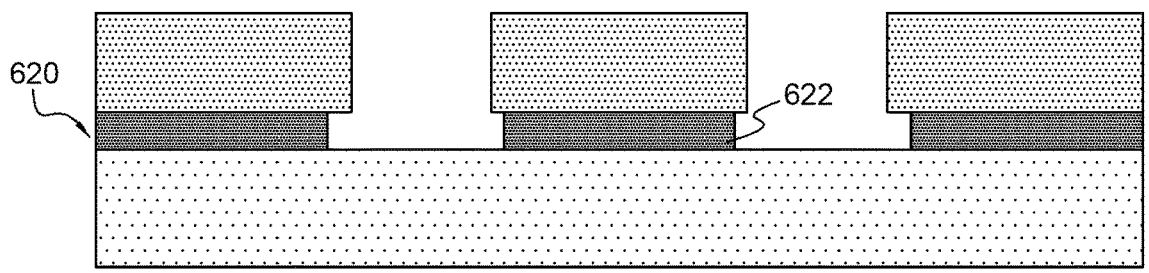
Figure 6C:
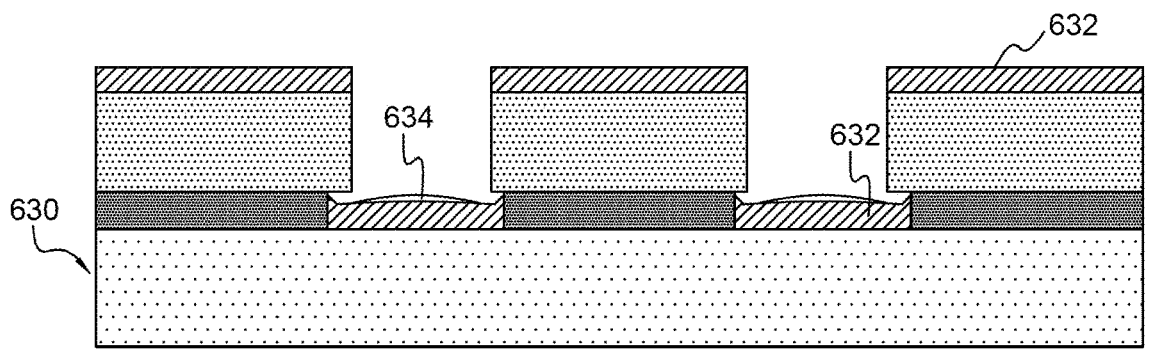
Figure 6D:
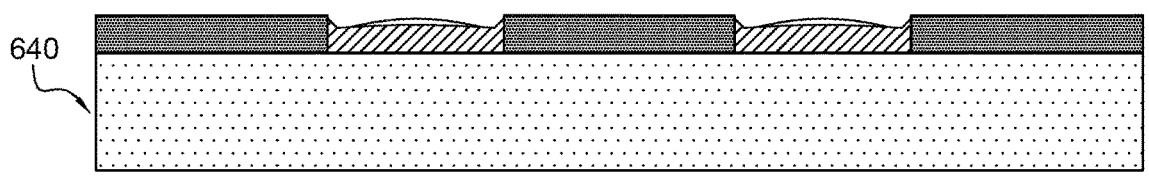
Figure 6E:
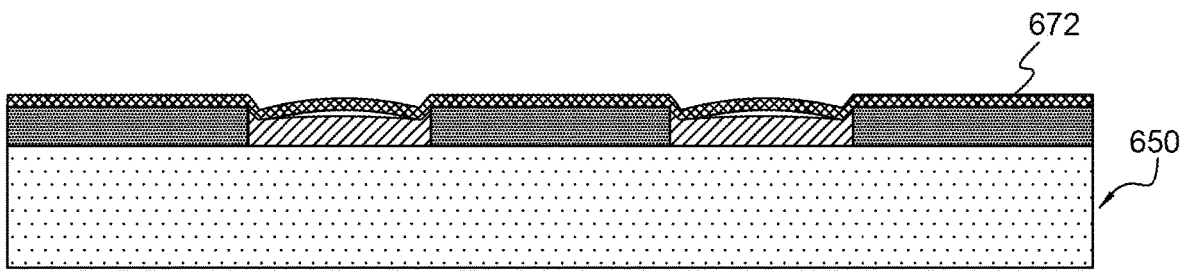
Figure 6F:
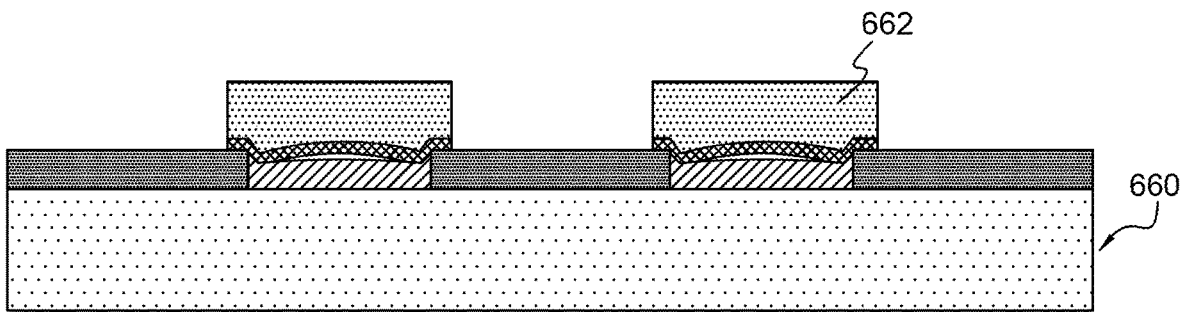
Figure 6G:
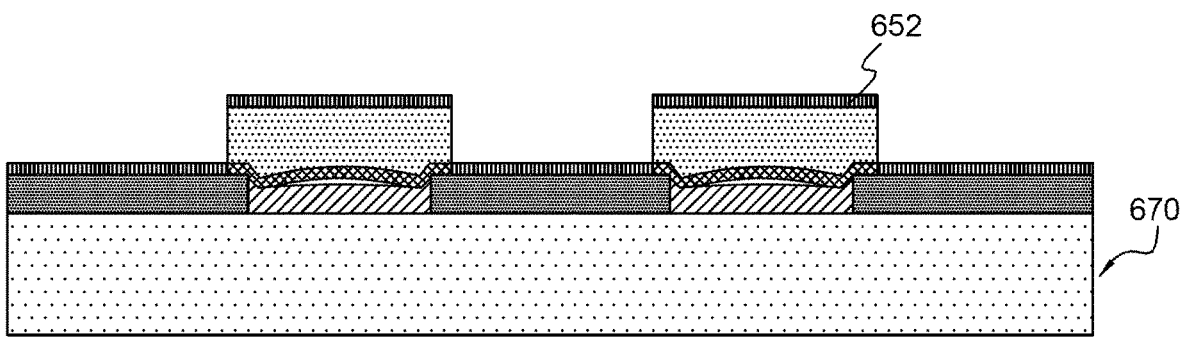
Figure 6H:
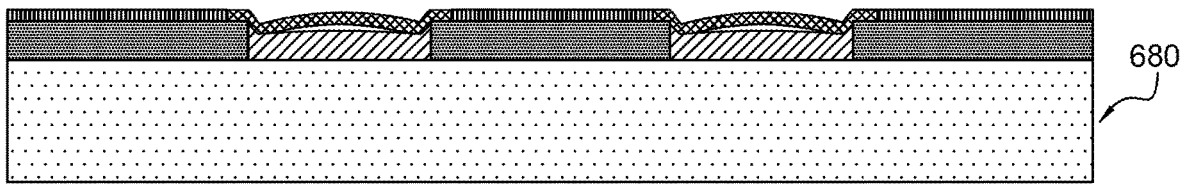

As shown in FIGS. 6A-6G, another embodiment of a method 600 for forming an LED die is disclosed. FIGS. 6A-6D generally correspond to FIGS. 1A-1D and FIGS. 3A-3D, and the steps are generally identical to the steps described above, i.e. step 110 corresponds to step 610, step 120 corresponds to step 620, etc. As shown in FIG. 6E, step 650 includes depositing a blanket of a second barrier layer 672 on the dielectric layer 614 and the metal contacts 632. During step 660, shown in FIG. 6F, a second photoresistive layer 662 is patterned onto the LED only in regions of desired electrical contact, i.e. metal contacts 632 and the first barrier layer 634. Step 660 also includes removing portions of the second barrier layer 672 only in areas away from the regions of desired electrical contact. As shown in FIG. 6G, step 670 includes depositing a blanket of a reflective film 652 on the dielectric layer 614 and the second photoresistive layer 662. During step 680 shown in FIG. 6H, portions of the combined layers of the second photoresistive layer 662 and the reflective film 652 are removed from the regions of desired electrical contact. This embodiment is similar to the embodiment shown in FIGS. 3A-3G in that this embodiment provides a reflective layer that extends directly against the barrier layer. This embodiment also ensures that reflective film is not deposited in the barrier layer encapsulation zone. This embodiment provides a coplanar arrangement between a top surface of the reflective film 652 and a top surface of the second barrier layer 672. This coplanar arrangement is provided at least in regions of the die adjacent to the areas of desired electrical contact. According to this embodiment, the upper surface topography has a surface roughness between 46.0 nm-50.0 nm, and more preferably has a surface roughness of 48.8 nm.

Figure 7A:
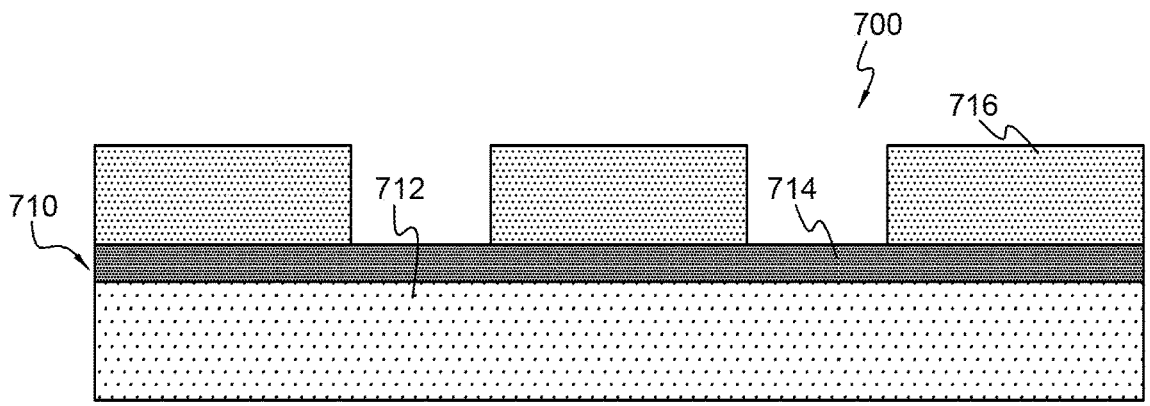
FIGS. 7A-7H illustrate steps for forming an LED die according to a fourth embodiment.
Figure 7B:
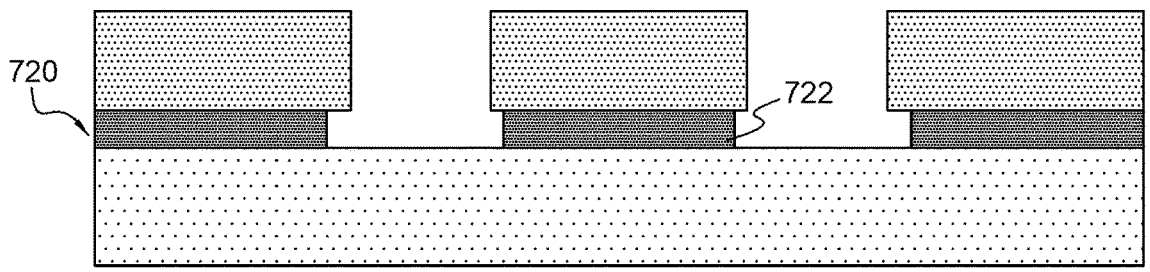
Figure 7C:
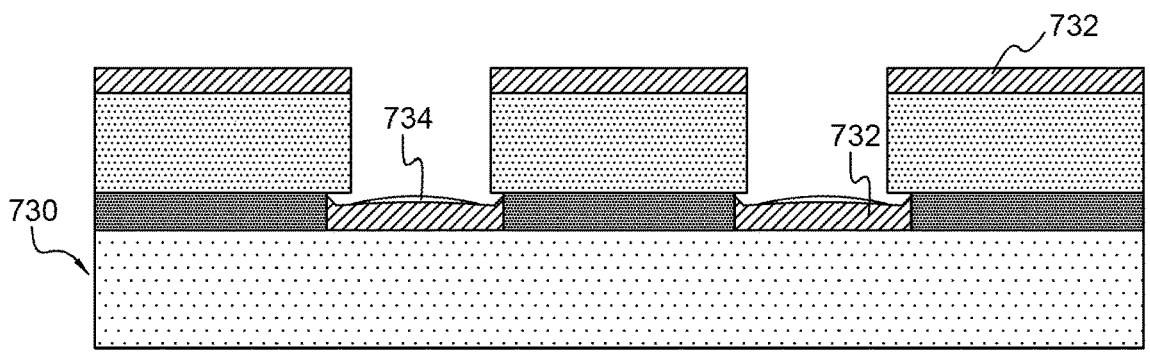
Figure 7D:
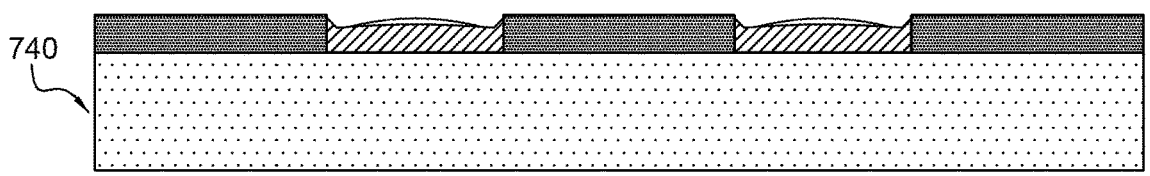
Figure 7E:
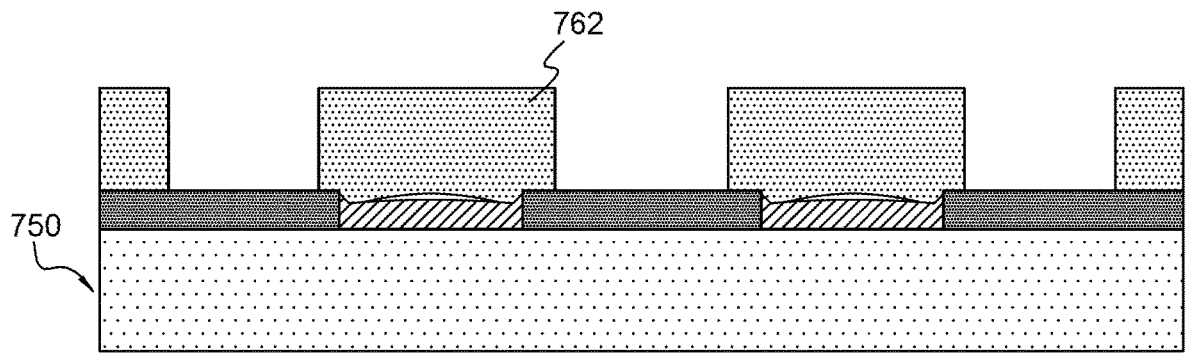
Figure 7F:
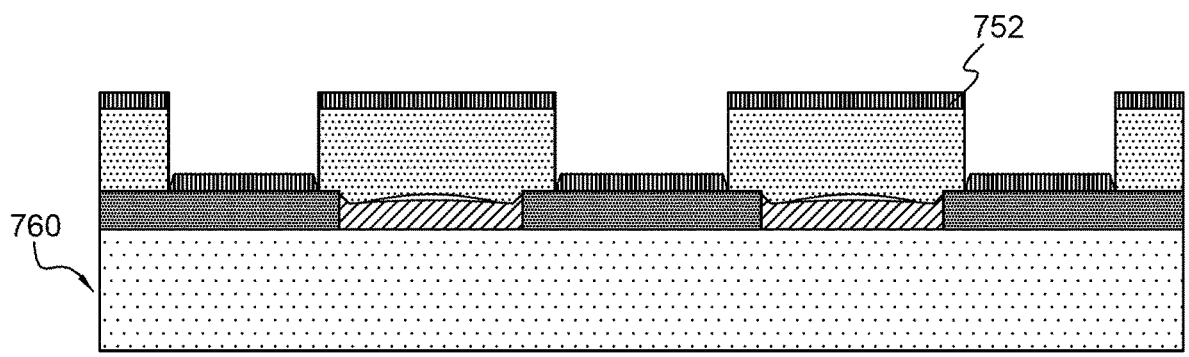
Figure 7G:
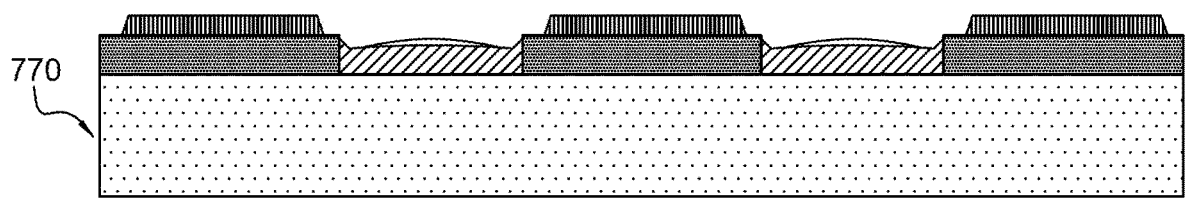
Figure 7H:
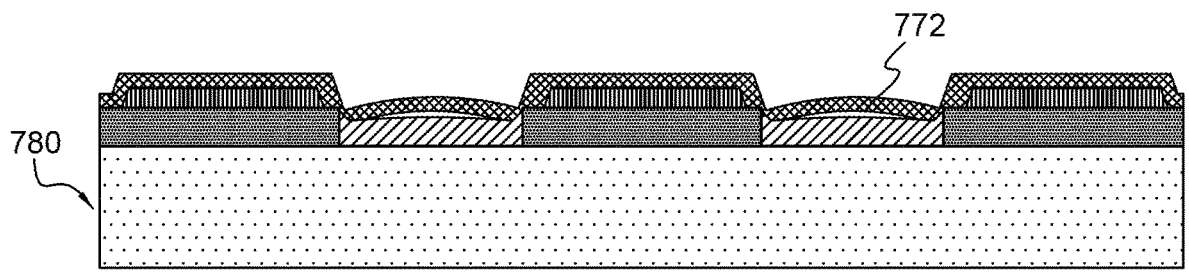

FIGS. 7A-7H illustrate another embodiment for forming an LED die 600. FIGS. 7A-7D generally correspond to FIGS. 1A-1D, 3A-3D, and 6A-6D. The embodiment of FIGS. 7A-7H includes depositing a second photoresistive layer 762 on the dielectric layer 714 in regions of desired electrical contact, i.e. metal contacts 732, as shown in FIG. 7E as step 750. FIG. 7F shows step 760, which includes depositing a blanket of reflective film 752 on the second photoresistive layer 762 and the dielectric layer 714. FIG. 7G illustrates step 770, which includes removing portions of the combined layers of the second photoresistive layer 762 and the reflective film 752 in areas away from the regions of desired electrical contact, i.e. away from the metal contacts 732. Finally, as shown in FIG. 71-1, the method includes step 780 which includes depositing a blanket of a second barrier layer 772 onto the dielectric layer 714, the metal contacts 732 (including the first barrier layer 734), and the reflective film 752. This embodiment also ensures that no reflective film 752 is deposited in the region of metal contact. According to this embodiment, the upper surface topography has a surface roughness between 74.0 nm-78.0 nm, and more preferably has a surface roughness of 76.8 nm.

Figure 8A:
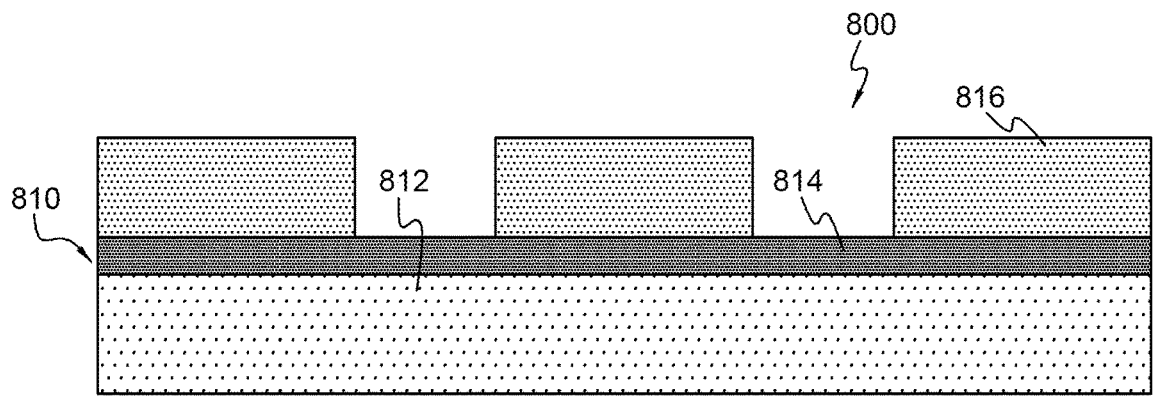
FIGS. 8A-8G illustrate steps for forming an LED die according to a fifth embodiment.
Figure 8B:
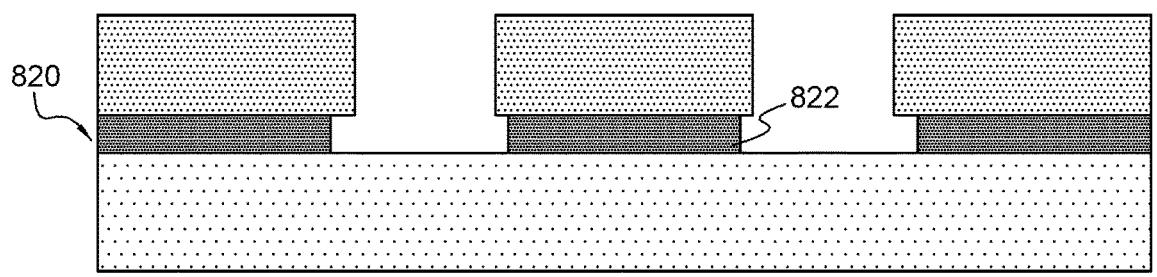
Figure 8C:
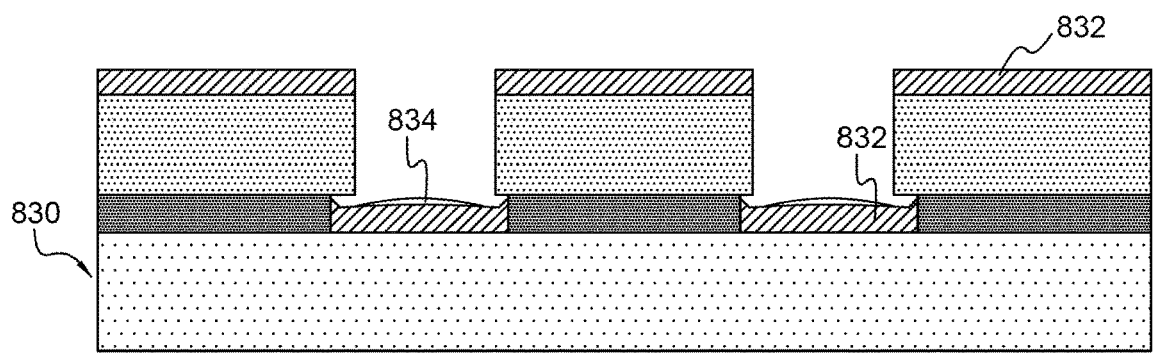
Figure 8D:
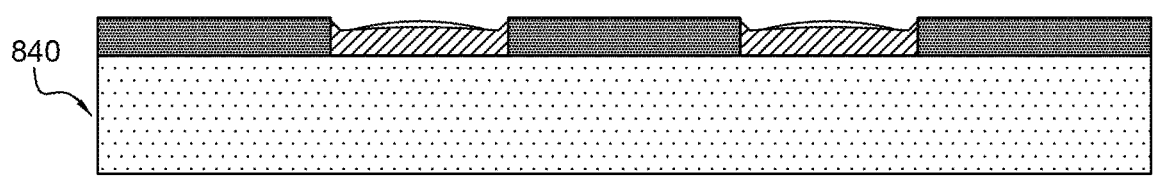
Figure 8E:
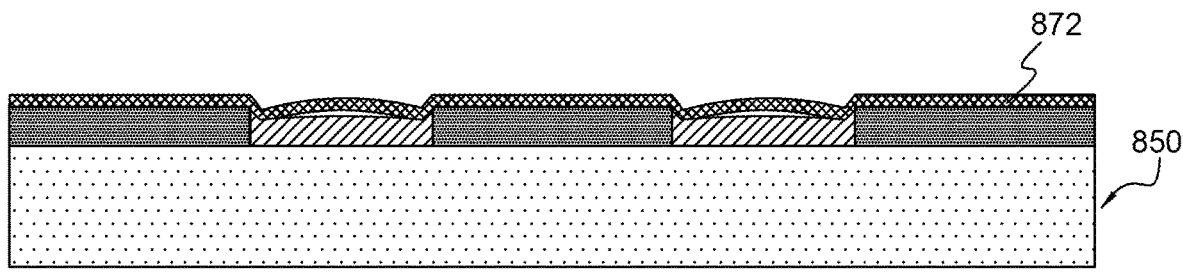
Figure 8F:
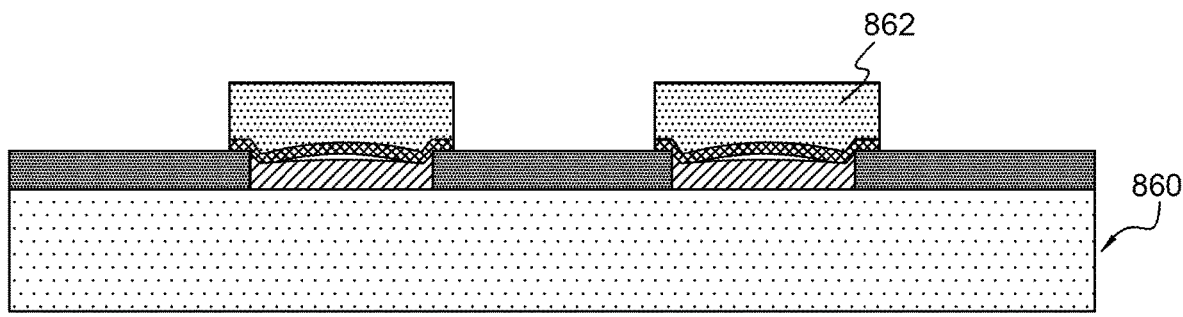
Figure 8G:
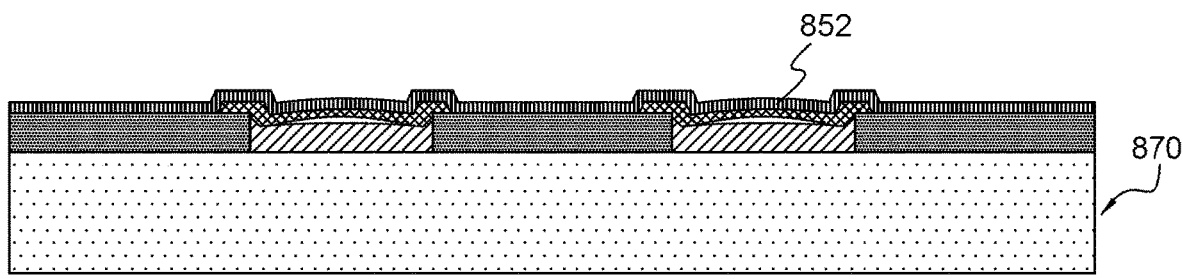

An additional embodiment for forming an LED die 800 is disclosed in FIGS. 8A-8G. FIGS. 8A-8D generally correspond to FIGS. 1A-1D, 3A-3D, 6A-6D, and 7A-7D. The embodiment of FIGS. 8A-8G includes step 850, shown in FIG. 8E, which shows depositing a blanket of a second barrier layer 872 onto an entire top surface of the LED arrangement, including the dielectric layer 814, and the combined layers of the first barrier layer 834 and the metal contacts 832. As shown in FIG. 8F, during step 860, a second photoresistive layer 862 is deposited on the second barrier layer 872 in the regions of desired electrical contact, i.e. regions of the combined layers of the first barrier layer 834 and the metal contacts 832. Portions of the second barrier layer 872 are also removed from areas away from the regions of desired electrical contact during step 860. Finally, as shown in FIG. 8G, during step 870, the second photoresistive layer 862 is removed and a blanket of a reflective film 852 is deposited onto the dielectric layer 814 and the second barrier layer 872. This embodiment provides similar advantages as the embodiments of FIGS. 3A-3G, 6A-6H, and 7A-7H ensures that the reflective layer abuts against the edge of the barrier layer. This embodiment also ensures that no reflective film 852 is deposited in the region of metal contact. According to this embodiment, the upper surface topography has a surface roughness between 72.0 nm-76.0 nm, and more preferably has a surface roughness of 74.7 nm.

Figure 9A:
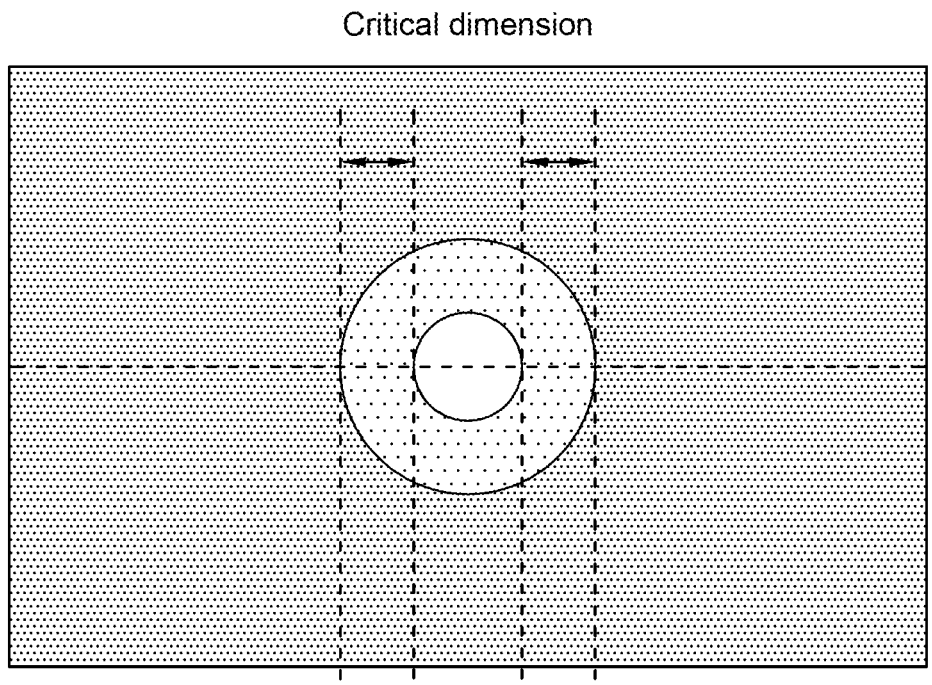
FIGS. 9A-9D illustrate a critical dimension for an LED die according to an embodiment.
Figure 9B:
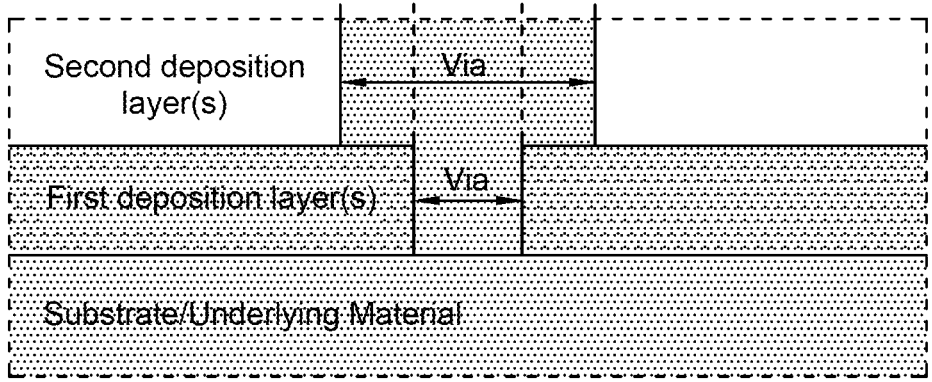
Figure 9C:
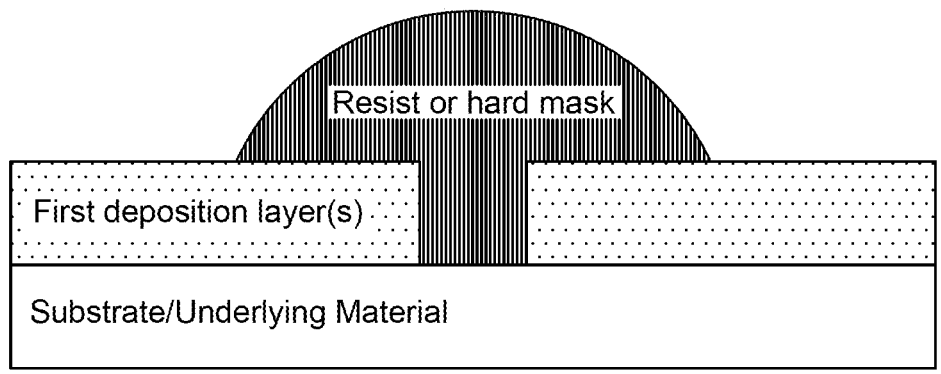
Figure 9D:
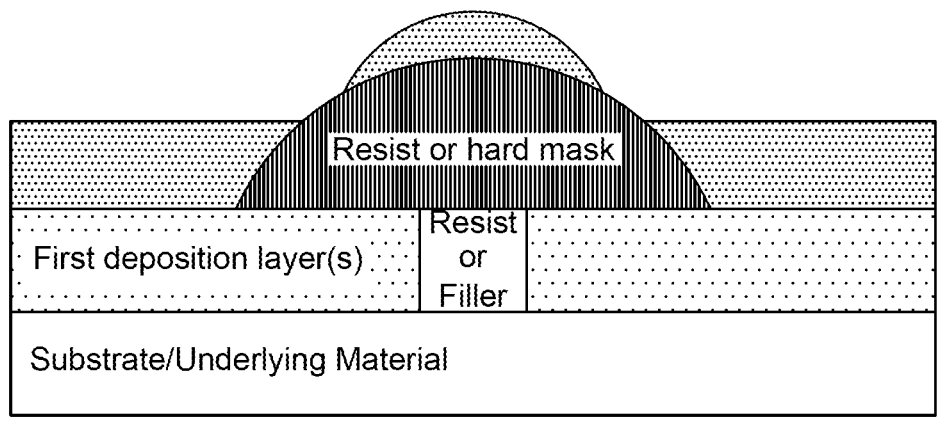

In an embodiment shown in FIGS. 9A-9D, a method for depositing thin films of materials on dielectric layers with minimum via size offset between the thin film layers and the dielectric layers is disclosed. The layers are deposited onto a wafer. The via size offset between the thin film layers and the dielectric layers, which is defined as the critical dimension (CD), is clearly illustrated in FIGS. 9A and 9B. In an embodiment, the method includes depositing a first layer of thin film as a first deposition. This step can include a single deposition step or multiple deposition steps. A first via is formed through the first deposition. The method includes depositing a second layer as a second deposition. The second deposition can include a single deposition step or multiple deposition steps. Next, a second via is formed through the second deposition. A position of the second via is correlated to a position of the first via. As shown in FIGS. 9A and 9B, the second via is concentric with the first via. One of ordinary skill in the art would recognize from the present disclosure that multiple layers can be deposited in the first or second deposition, and multiple vias can be included in the first via or the second via. This arrangement provides tight CD control between vias from the first and second depositions. This arrangement also prevents material from the second deposition from entering vias made in the first deposition and landing on the underlying material/substrate. A method to minimize the CD while preventing material from the second deposition step from entering into the via made in the first deposition is disclosed. In an embodiment shown in FIG. 9C, the method includes using a mask to break the continuity of contact of the material from the second deposition step to the first deposition step. In an embodiment, the mask is then removed. In another embodiment, the mask is not removed. In an embodiment, the first deposition consists of a dielectric layer, such as SiO2, deposited onto a wafer. A resist layer is applied and patterned by lithography and this pattern is transferred to the dielectric layer. In an embodiment, the pattern is transferred by subtractive methods, e.g. etching. The etch removes material from the dielectric layer, creating vias that can be filled with material if desired. The resist layer is then removed and a new resist layer is applied and patterned. If the resist layer is used to break the continuity of the second deposition at the via, the same mask can be used but with opposite polarity, which results in the resist layer remaining on top of the vias. Alternatively, if the same resist layer and mask polarity are used, a hard mask can be deposited into the vias and patterned by the lift-off method. At this stage, the vias in the first deposition layer are formed with a resist layer or hard mask cap on top of the vias. The CD defined in this technique is the smallest CD possible as the technique ensures that material over the via (i.e. the resist layer or hard mask) has the smallest possible "footprint." This ensures that the surface area in contact between the first and second depositions is maximized while material from the second deposition layer is prevented from creeping into the vias made in the first deposition layer. This method can be replicated for subsequent depositions, if required, to continue the upward growth of the via while minimizing the horizontal growth rate per deposition step.

One of ordinary skill in the art would recognize from the present embodiments that the method and configuration described herein can be applied to any LED architecture. In particular, the methods and configurations described herein can be applied to any LED architecture that uses metal contact and a reflective layer.

The present embodiments can be implemented using standard manufacturing equipment according to known wafer fabrication assemblies and methods. The present embodiments can be incorporated into a modified flow of existing manufacturing process in wafer fabrication to enable the die architecture change.

The non-limiting methods and embodiments described herein for an LED die may be modified for a variety of applications and uses while remaining within the spirit and scope of the claims. The implementations and variations described herein, and/or shown in the drawings, are presented by way of example only and are not limiting as to the scope and spirit. The descriptions herein may be applicable to all implementations of the method and system described herein although it may be described with respect to a particular implementation.

As described herein, the methods described herein are not limited to any particular element(s) that perform(s) any particular function(s) and some steps of the methods presented need not necessarily occur in the order shown. For example, in some cases two or more method steps may occur in a different order or simultaneously. In addition, some steps of the described methods may be optional (even if not explicitly stated to be optional) and, therefore, may be omitted. These and other variations of the methods disclosed herein will be readily apparent, especially in view of the description of the method for using sputtering deposition to grow layers in light emitting devices described herein, and are considered to be within the full scope of the invention.

Some features of some implementations may be omitted or implemented with other implementations. The device elements and method elements described herein may be interchangeable and used in or omitted from any of the examples or implementations described herein. Although features and elements are described above in particular combinations, each feature or element can be used alone without the other features and elements or in various combinations with or without other features and elements.

What is claimed is:

1. A method comprising:
   providing a wafer comprising an epitaxy layer, a dielectric layer over the epitaxy layer, at least one via in the dielectric layer, and a metal contact in the at least one via;
   patterning a photoresistive layer on the dielectric layer in regions that are not adjacent the at least one via;
   depositing a barrier layer over exposed portions of the metal contact, the dielectric layer and the photoresistive layer;
   removing the photoresistive layer and regions of the barrier layer overlaying the photoresistive layer; and
   depositing a reflective layer over an entire surface of the barrier layer and the dielectric layer.

2. The method of claim 1, wherein the removing the photoresistive layer and the regions of the barrier layer comprises performing a lift-off of the photoresistive layer and the regions of the barrier layer.

3. The method of claim 1, wherein the reflective layer is deposited such that a lateral edge of the reflective layer abuts directly against a lateral edge of the barrier layer.

4. The method of claim 1, further comprising roughening the reflective layer such that a roughened surface of the reflective layer a surface roughness of between 46.0 nm-50.0 nm.

5. The method of claim 1, further comprising depositing another barrier layer on the contact before depositing the barrier layer over the metal contact and the portion of the dielectric layer adjacent the metal contact.

6. A device comprising:
   an epitaxial layer;
   a dielectric layer over the epitaxial layer, the dielectric layer defining at least one via;
   a metal contact in the at least one via;
   a barrier layer over the metal contact and a portion of the dielectric layer adjacent the metal contact; and
   a reflective layer over an entire surface of the barrier layer and the dielectric layer.

7. The device of claim 6, wherein a lateral edge of the reflective layer abuts directly against a lateral edge of the barrier layer.

8. The device of claim 6, wherein the reflective layer contacts the dielectric layer in a region between adjacent metal contacts.

9. The device of claim 6, wherein the metal contact comprises a gold beryllium (AuBe) compound.

10. The device of claim 6, wherein an upper surface of the reflective layer has a surface roughness between 46.0 nm and 50.0 nm.

11. The device of claim 6, further comprising another barrier layer between the metal contact and the barrier layer.

12. The device of claim 6, wherein the reflective layer comprises one of Ag and Al.

13. The device of claim 6, wherein the device is a light-emitting diode (LED) device.

14. The device of claim 6, wherein the device is a wafer of light-emitting diode (LED) devices.

15. The device of claim 6, wherein the epitaxy layer comprises at least one gallium phosphide (GaP) material.

16. The device of claim 6, wherein the reflective layer is in direct contact with the barrier layer.

* * * * *